United States Patent

Zussy et al.

(10) Patent No.: US 8,329,048 B2
(45) Date of Patent: Dec. 11, 2012

(54) METHOD FOR TRIMMING A STRUCTURE OBTAINED BY THE ASSEMBLY OF TWO PLATES

(75) Inventors: Marc Zussy, St. Egreve (FR); Bernard Aspar, Rives (FR); Chrystelle Lagahe-Blanchard, St. Joseph de Riviere (FR); Hubert Moriceau, St. Egreve (FR)

(73) Assignees: Commissariat a l'Energie Atomique, Paris (FR); S.O.I. TEC Silicon On Insulator Technologies of Chemin des Franques, Bernin (FR)

( * ) Notice: Subject to any disclaimer, the term of this patent is extended or adjusted under 35 U.S.C. 154(b) by 935 days.

(21) Appl. No.: 11/722,115

(22) PCT Filed: Dec. 22, 2005

(86) PCT No.: PCT/FR2005/051128
§ 371 (c)(1),
(2), (4) Date: Jun. 19, 2007

(87) PCT Pub. No.: WO2006/070160
PCT Pub. Date: Jul. 6, 2006

(65) Prior Publication Data
US 2009/0095399 A1 Apr. 16, 2009

(30) Foreign Application Priority Data
Dec. 28, 2004 (FR) ..................... 04 13979

(51) Int. Cl.
B23B 37/02 (2006.01)
(52) U.S. Cl. ............... 216/36; 216/52; 156/60
(58) Field of Classification Search .............. None
See application file for complete search history.

(56) References Cited

U.S. PATENT DOCUMENTS

| | | | | |
|---|---|---|---|---|
| 5,032,544 A | * | 7/1991 | Ito et al. | 438/459 |
| 5,233,218 A | * | 8/1993 | Miura | 257/618 |
| 5,258,323 A | * | 11/1993 | Sarma et al. | 438/29 |
| 5,340,435 A | * | 8/1994 | Ito et al. | 438/459 |
| 5,395,788 A | * | 3/1995 | Abe et al. | 438/690 |
| 5,494,849 A | * | 2/1996 | Iyer et al. | 438/459 |
| 5,665,631 A | * | 9/1997 | Lee et al. | 438/459 |
| 5,668,045 A | * | 9/1997 | Golland et al. | 438/459 |

(Continued)

FOREIGN PATENT DOCUMENTS

EP  0 935 280  8/1999

(Continued)

*Primary Examiner* — Allan Olsen
(74) *Attorney, Agent, or Firm* — Oblon, Spivak, McClelland, Maier & Neustadt, L.L.P.

(57) ABSTRACT

A method for trimming a structure obtained by bonding a first wafer to a second waver on contact faces and thinning the first waver, wherein at least either the first wafer or the second wafer is chamfered and thus exposes the edge of the contact face of the first wafer, wherein the trimming concerns the first wafer. The method includes a) selecting the second wafer from among wafers with a resistance to a chemical etching planned in b) that is sufficient with respect to the first wafer to allow b) to be carried out; b) after bonding the first wafer to the second wafer, chemical etching the edge of the first wafer to form in the first wafer a pedestal resting entirely on the contact face of the second wafer and supporting the remaining of the first wafer; and c) thinning the first wafer until the pedestal is reached and attacked, to provide a thinned part of the first wafer.

8 Claims, 5 Drawing Sheets

U.S. PATENT DOCUMENTS

| | | | |
|---|---|---|---|
| 5,834,812 A * | 11/1998 | Golland et al. | 257/347 |
| 5,863,829 A * | 1/1999 | Nakayoshi et al. | 438/459 |
| 5,918,139 A * | 6/1999 | Mitani et al. | 438/459 |
| 5,937,312 A * | 8/1999 | Iyer et al. | 438/459 |
| 6,004,860 A * | 12/1999 | Ogawa et al. | 438/406 |
| 6,090,688 A * | 7/2000 | Ogawa et al. | 438/459 |
| 6,110,391 A * | 8/2000 | Takei et al. | 216/2 |
| 6,214,702 B1 * | 4/2001 | Kim | 438/459 |
| 6,291,315 B1 * | 9/2001 | Nakayama et al. | 438/459 |
| 6,391,743 B1 * | 5/2002 | Iwane et al. | 438/458 |
| 6,534,384 B2 * | 3/2003 | Nakano et al. | 438/459 |
| 6,563,172 B2 * | 5/2003 | Yoshida et al. | 257/347 |
| 6,624,047 B1 * | 9/2003 | Sakaguchi et al. | 438/458 |
| 6,830,985 B2 * | 12/2004 | Oi et al. | 438/401 |
| 6,841,848 B2 * | 1/2005 | MacNamara et al. | 257/618 |
| 6,844,242 B2 * | 1/2005 | Naruoka et al. | 438/455 |
| 6,872,979 B2 * | 3/2005 | Yoshida et al. | 257/70 |
| 6,953,948 B2 * | 10/2005 | Sakaguchi | 257/48 |
| 7,195,988 B2 * | 3/2007 | Nemoto et al. | 438/459 |
| 7,264,996 B2 * | 9/2007 | Moriceau et al. | 438/110 |
| 7,368,332 B2 * | 5/2008 | Moriwaki et al. | 438/149 |
| 7,442,992 B2 * | 10/2008 | Tomita et al. | 257/347 |
| 7,727,860 B2 * | 6/2010 | Miyazaki et al. | 438/459 |
| 7,749,861 B2 * | 7/2010 | Takeno et al. | 438/455 |
| 2001/0055854 A1 | 12/2001 | Nishida et al. | |
| 2001/0055863 A1 * | 12/2001 | Nakano et al. | 438/549 |
| 2002/0023725 A1 | 2/2002 | Bryan et al. | |
| 2003/0102530 A1 * | 6/2003 | Matsumoto et al. | 257/618 |
| 2005/0112847 A1 * | 5/2005 | Moriceau et al. | 438/458 |
| 2006/0055003 A1 * | 3/2006 | Tomita et al. | 257/629 |
| 2007/0072393 A1 * | 3/2007 | Aspar et al. | 438/459 |
| 2009/0093106 A1 * | 4/2009 | Tomita et al. | 438/479 |
| 2009/0095399 A1 * | 4/2009 | Zussy et al. | 156/60 |

FOREIGN PATENT DOCUMENTS

| | | |
|---|---|---|
| EP | 1 026 728 | 8/2000 |

* cited by examiner

METHOD FOR TRIMMING A STRUCTURE OBTAINED BY THE ASSEMBLY OF TWO PLATES

TECHNICAL FIELD

This invention relates to a method for trimming a structure obtained by the assembly of two wafers. In particular it concerns a semi-conductor structure, for example a BSOI structure.

STATE OF THE PRIOR TECHNIQUE

Today, in the field of micro electronics, an increasing number of structures are obtained by the assembly of two wafers made from semi-conductor materials that may be completely or partially processed. For example, to make a BSOI structure (Bonded Silicon On Insulator), two silicon wafers are assembled by molecular adhesion. More precisely, this assembly comprises a surface preparation step, a contact step and a heat treatment step for example at 1100° C. for 2 hours. Subsequently, at least one of the two wafers is made thinner by grinding and/or mechanical-chemical polishing.

FIGS. 1A to 1C show a classic method for manufacturing a BSOI structure.

FIG. 1A shows a step of the method in which a first silicon wafer 1 and a second silicon wafer 2 are brought into contact. The contact face of wafer 2 is the free face of a layer of silicon oxide 3 formed on wafer 2. This layer of silicon oxide can typically have a thickness of between 0.3 µm and 3 µm. FIG. 1B shows the two wafers 1 and 2 during the direct bonding step. FIG. 1C shows the structure obtained after wafer 1 has been made thinner to provide a thin layer 4 whose thickness is for example between 5 µm and 100 µm.

The silicon wafers assembled are wafers of standard dimension (of diameter 100, 125, 150, 200 or 300 mm) or any other dimension. They are chamfered on the edges, as shown (without respecting the scale) on FIGS. 1A to 1C, in order to avoid problems of breaking that are likely to occur during the manufacturing methods of components on the BSOI structures.

These chamfers on the edges of the wafers lead to the presence of a peripheral zone of the thin layer that is not bonded to the support substrate. This peripheral zone has to be eliminated as it is likely to break unpredictably and to contaminate the structure with unwanted fragments or particles.

To overcome this problem, a trimming step is carried out to eliminate the peripheral zone of the thin layer. The trimming step is usually carried out mechanically. FIG. 2 shows the structure obtained, wherein the thin layer 5 no longer has a non bonded peripheral zone.

The trimming step may consist of mechanically machining the edge of the wafer to be made thinner attached to the support wafer. However, it is difficult to machine the upper wafer of the structure (which is to say the wafer to be made thinner) without touching or damaging the lower wafer (or support wafer). In fact, the interface between the two bonded wafers is very precise, and it is impossible to stop this machining very safely at this interface.

To overcome this problem, the document JP-A-11-067 701 proposes a first step for mechanical thinning, followed by chemical thinning to reach the interface. However, between these two steps, the edges of the wafers are fragile, which can make handling in particular difficult.

Another possibility consists of machining the edges of the upper wafer of the structure to the point of machining a small thickness of the lower support wafer as shown in the document WO-A-96/17377. This machining however gives a surface finish whose roughness and level of particle contamination is not always compatible with the field of micro electronics. It is therefore necessary to rework the machined edges to improve their surface finish, for example by mechanical-chemical polishing.

DESCRIPTION OF THE INVENTION

This invention permits the disadvantages of the prior art to be overcome.

In the invention, the geometry of the upper wafer and/or the lower wafer is used, due to chamfering, to obtain suitable trimming. An etching solution is selected to attack the upper wafer of the stacked structure. This chemical attack may be homogenous on the entire non bonded part of the upper wafer of the structure or mainly located at the level of the future thin layer.

The purpose of the invention is a method for trimming a structure obtained by bonding a first wafer onto a second wafer by contact faces and thinning the first wafer, wherein at least either the first wafer or the second wafer is chamfered and thus the edge of the contact face of the first wafer is exposed, the trimming is on the first wafer, characterised in that the method comprises the following steps:

a) selection of the second wafer from among the wafers with a resistance to chemical etching that is part of step b) that is sufficient with respect to the first wafer to allow step b) to be carried out;

b) after bonding the first wafer to the second wafer, chemical etching of the edge of the first wafer so as to form, in the first wafer, a pedestal that rests entirely on the contact face of the second wafer and that supports the remaining of the first wafer;

c) thinning of the first wafer until the pedestal is reached and attacked so as to provide a thin part of the first wafer.

The method of the invention allows the lowest trimming possible to be obtained with respect to the geometry of the wafers. The trimming operation itself (corresponding to step b)) is a chemical etching operation and not a mechanical operation. The method of the invention is also simpler than the methods of the known prior art as certain steps are eliminated.

In a first embodiment, the selection step consists of choosing, as the second wafer, a wafer whose surface is made of a different material from that of the surface of the first wafer and which permits selective chemical etching of the first wafer with respect to the second wafer. In this case, if the first wafer (or at least its surface) is made of silicon, the second wafer may be chosen for example from among the wafers made of quartz, SiC, sapphire or substituted silicon (doped or recombined to form for example SiGe).

In a second embodiment, the selection step consists of choosing, as the second wafer, a wafer with a layer of at least one material forming means of stopping the said chemical attack. If the first wafer and the second wafer are made of silicon, the layer of material forming the stoppage means may be a layer of $SiO_2$ or $Si_3N_4$.

In a third embodiment of the method, the contact face of the first wafer has a layer of protection from the chemical etching for forming the pedestal, wherein this protective layer is positioned so that it does not prevent the formation of the pedestal. This protective layer may be a layer that initially covers the surface of the first wafer, wherein the method thus comprises, prior to the chemical etching step for forming the pedestal, chemical etching of the part of the protective layer that is accessible.

In this third embodiment, the second wafer may be also covered by a layer for protecting against the chemical etching for forming the pedestal. If the protective layers of the first and the second wafer are made of a same material, a thicker protective layer will be chosen for the second wafer. If the protective layers of the first wafer and the second wafer are made of different materials, for the second wafer a material will be chosen that is etched more slowly than the material of the protective layer of the first wafer. For example, if the two wafers are made of silicon, we will choose a deposited oxide for the protective layer of the first wafer and a heat treated oxide for that of the second wafer.

The first wafer may be bonded to the second wafer by a molecular bonding technique. In this case, the bonding energy between the first wafer and the second wafer may be taken into account to obtain a determined width of lateral chemical etching of the first wafer at the bonding interface. As a variant, the bonding may be achieved using glue.

In a fourth embodiment of the method, the selection step consists of choosing, as the second wafer, a wafer that can receive a layer of glue that permits the first wafer to be bonded to the second wafer, wherein the layer of glue acts as means of stopping the chemical etching.

In a fifth embodiment of the method, wherein the first wafer has a protective layer against the chemical etching for forming the pedestal, the method thus comprises, prior to the chemical etching for forming the pedestal, chemical etching to eliminate the part of the protective layer that is situated at the level of the future pedestal. If the second wafer has a protective layer, then chemical etching to eliminate part of this layer may also be included to allow the pedestal to be created, extending to either side of the bonding interface.

The first wafer may be thinning using mechanical means (such as grinding), by chemical etching, by lift-off, by dry etching, by fracture at a fragile zone inside the first wafer or by a combination of these techniques.

BRIEF DESCRIPTION OF THE DRAWINGS

The invention will be more easily understood and other advantages and specific aspects will become clearer after reading the following description, provided by way of a non restrictive example, accompanied by appended drawings in which.

DETAILED DESCRIPTION OF SPECIFIC EMBODIMENTS

Figure 1A:
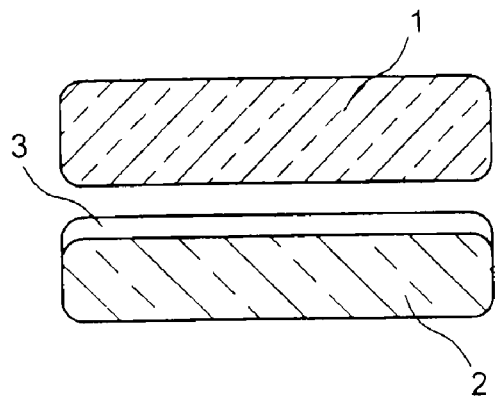
FIGS. 1A to 1C, already described, show a classic method for manufacturing a BSOI structure.
Figure 1B:
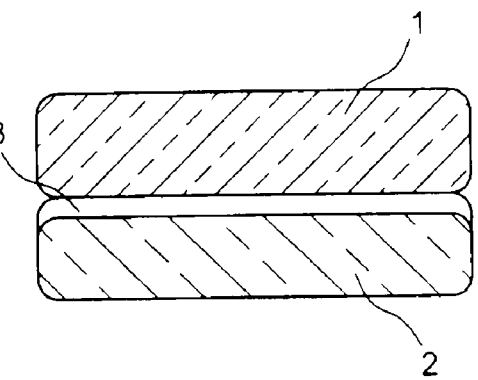
Figure 1C:
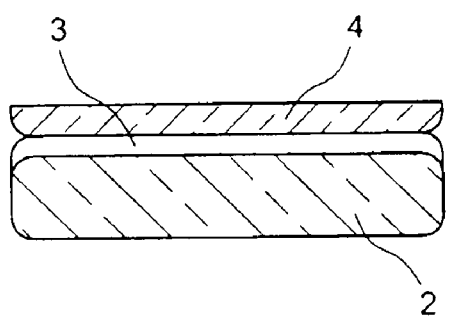
Figure 2:
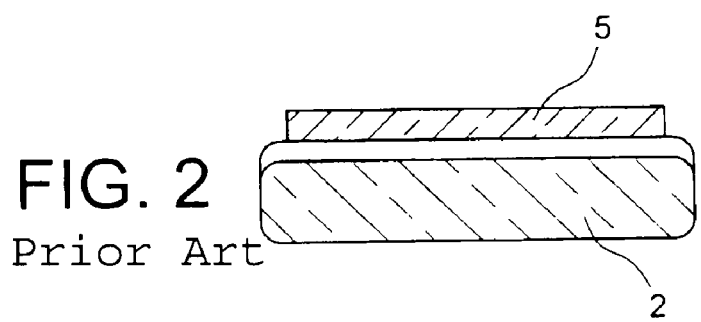
FIG. 2, already described, shows a BSOI structure trimmed by a method of the known art.
Figure 3A:
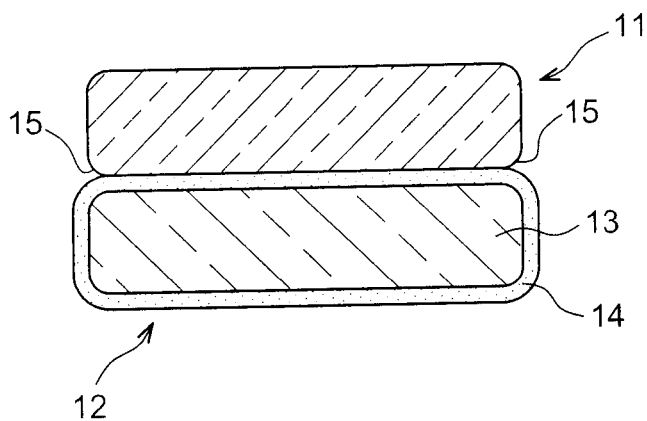
FIGS. 3A to 3C show a first embodiment of the method of the invention.
Figure 3B:
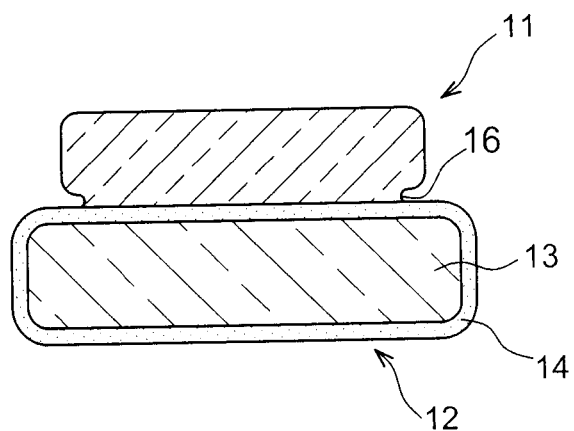
Figure 3C:
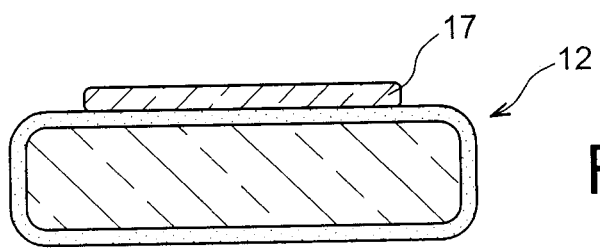

FIGS. 3A to 3C are cross sectional views showing a first embodiment of the method of the invention.

FIG. 3A shows the assembly of a first wafer 11 and a second wafer 12 bonded to one another on the contact faces. Wafer 11 is a silicon wafer. Wafer 12 is a silicon wafer 13 covered with a layer of silicon oxide 14. Bonding is achieved using a molecular adhesion technique well known to those skilled in the art. The adhesion is carried out for example at ambient temperature, and is then reinforced by heat treatment, for example between 900 and 1200° C. for 2 hours. The atmosphere of the heat treatment may be argon with approximately 2% oxygen (which is to say 98% argon and 2% oxygen in volume).

Wafer 11 in silicon then undergoes de-oxidation to eliminate the native oxide, for example by HF diluted at 10%, and then chemical etching for example with the TMAH (tetramethylammonium hydroxide) or with KOH. It is also possible to carry out selective dry etching. All of the free surface of the wafer 11 undergoes this chemical etching and in particular the chamfered zone with the reference 15 in FIG. 3A. The chemical etching is carried out so as to obtain a pedestal 16 at the contact faces of the two wafers, wherein the pedestal rests entirely on the second wafer 12 (see FIG. 3B). If the bond is strong enough, the width of the pedestal corresponds more or less to the bonding zone of the two wafers. As described below, the weaker the bond, the narrower the pedestal. The pedestal may be obtained by chemical etching of the wafer 11 on a thickness of around 80 μm. In the case of TMAH being used as the chemical etching product, then TMAH diluted to 25% may be used, at a temperature of 80° C. for 4 hours. This etching solution has the advantage of being highly selective (greater than 1000 between the silicon and the silicon oxide) and thus only etches very lightly the layer of oxide 14 of the wafer 12.

Once the pedestal has been obtained, the silicon wafer 11, already made slightly thinner by the chemical etching, is made thinner on its free face, for example by mechanical action. To this end, a rapid grinding method may be used with a grinding wheel with a grain of around 50 μm (reference #325) for example. This grinding is completed by fine grinding which consists for example of grinding the thinned wafer with a grinding wheel with a grain of around 8 μm (reference #2000), or even finer. This step allows as much of the zone as possible that has been work hardened during the previous grinding operation to be removed. The etching step is carried out until the pedestal is reached.

A final polishing step may be carried out to prepare a surface finish that is compatible for example with epitaxy. Such a surface finish is called "epi-ready" by those skilled in the art.

The thickness that remains after the etching operations is determined according to the thickness required for the application in question. The thickness of the wafer 11 etched by the chemical etching solution is therefore also determined according to the desired thickness of the thin layer 17 (see FIG. 3C). Advantageously, the pedestal will have, after the rapid grinding step, a thickness greater than the thickness of the thin layer 17. It can then be seen that the edges of the SOI structure obtained are clean and well defined.

In one variant of this example, the first wafer may be made of germanium and the second wafer made of silicon that may or may not be oxidised. Etching using $H_2O_2$ heated to 70° C. permits the germanium to be etched to form the pedestal (for example 60 μm high). This etching has no effect on the second wafer that is made of silicon. The thinning may then permit a SGOI structure to be obtained, for example comprising a thin layer of germanium of between 10 and 40 μm thick.

FIGS. 4A to 4D are cross sectional views illustrating a second embodiment of the method of the invention.

Figure 4A:
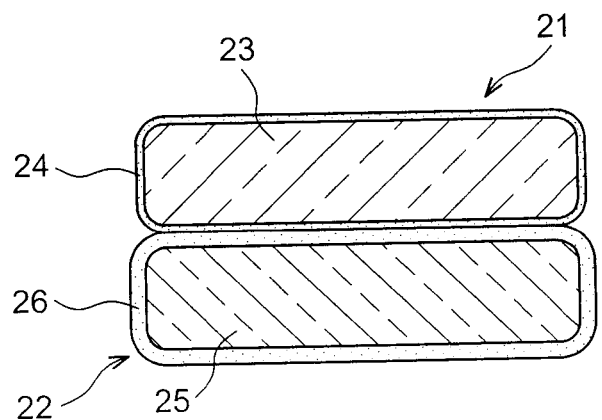
FIGS. 4A to 4D show a second embodiment of the method of the invention.
Figure 4B:
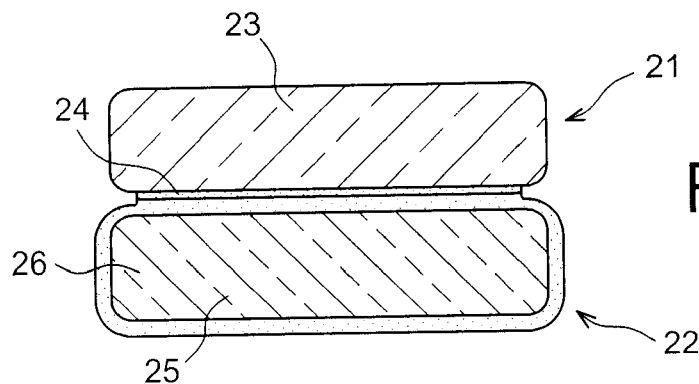
Figure 4C:
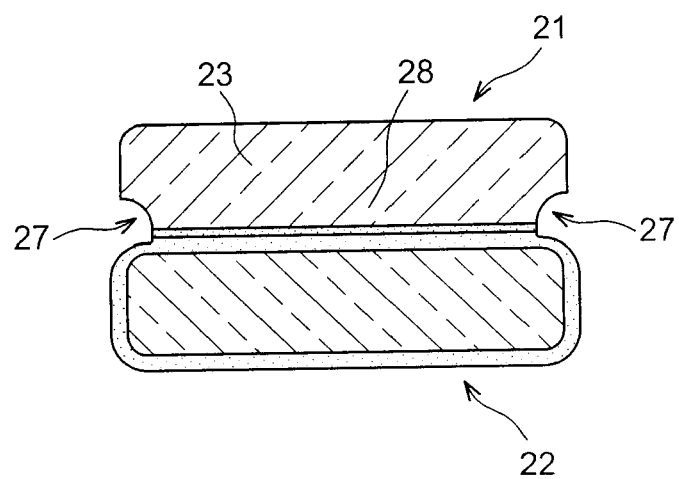

FIG. 4A shows the assembly of a first wafer 21 and a second wafer 22 bonded to each other via the contact faces. The wafer 21 is a silicon wafer 23 covered with a silicon oxide layer 24. The wafer 22 is also a silicon wafer 25 covered with a silicon oxide layer 26. The silicon oxides 24 and 26 are either both heat treated oxides, or they are both deposited oxides but the thickness of the layer of oxide 24 is thinner than that of the layer of oxide 26. The wafers 21 and 22 have been bonded using a molecular adhesion technique at ambient temperature. The adhesion is strengthened by heat treatment, for example between 900 and 1200° C. for 2 hours. The atmosphere of the heat treatment may be argon with 2% oxygen (98% argon and 2% oxygen in volume).

Then a first chemical etching operation is performed to deoxidise the free surface of the wafer 21. HF diluted at 10% may be used. We obtain the structure shown in FIG. 4B which shows that the free edges including the chamfered zones of the wafer 21 are deoxidised.

A second chemical etching using TMAH diluted at 25% for example is then carried out, to reduce the thickness of silicon of the wafer 23. All of the free surface of the silicon wafer 23 undergoes this chemical etching and in particular the lower chamfered zone 27. The chemical etching is carried out so as to obtain part 28 of the pedestal at the contact faces des wafers 21 and 22, wherein this part 28 rests entirely on the second wafer 22 by means of the remaining layer of oxide 24 (see FIG. 4C). This may be obtained by chemical etching of the silicon 23 on a thickness for example of 80 μm. In the case of TMAH being used as the chemical etching product, the etching solution may be at a temperature of 80° C. and the etching may last 4 hours.

The following step consists of thinning the silicon wafer 23 that has already been partially thinned chemically. To this end, it is possible to provide a fragile zone inside this wafer, for example by implanting gases (for example hydrogen) on the face to be assembled prior to bonding. This buried fragile zone is then fractured, for example by heat treatment and/or mechanically.

Figure 4D:
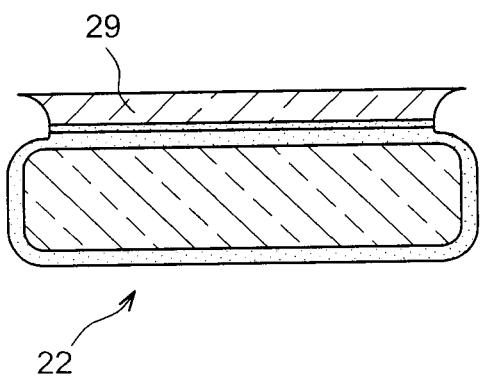

As seen previously, the free surface of the first thinned wafer may then be polished to obtain an "epi-ready" surface finish. FIG. 4D shows the structure obtained where the reference 29 designates the thin part of the first wafer.

The thinning may also be obtained by various other techniques selected from chemical etching or dry etching (ionic, reactive ionic, etc.), or even "lift-off" techniques.

Figure 5A:
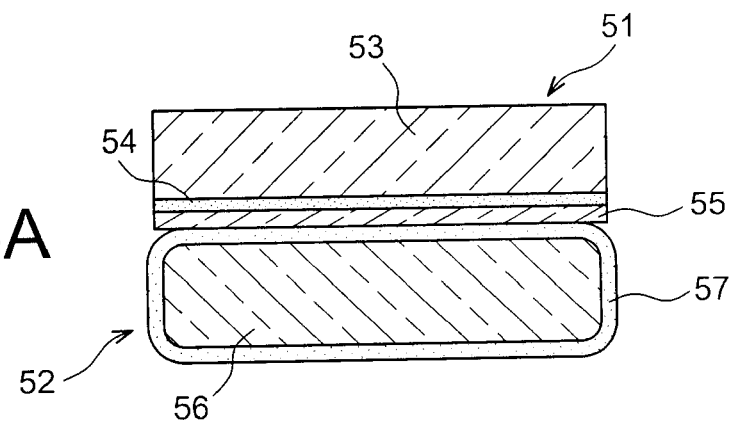
FIGS. 5A to 5C show a third embodiment of the method of the invention.
Figure 5B:
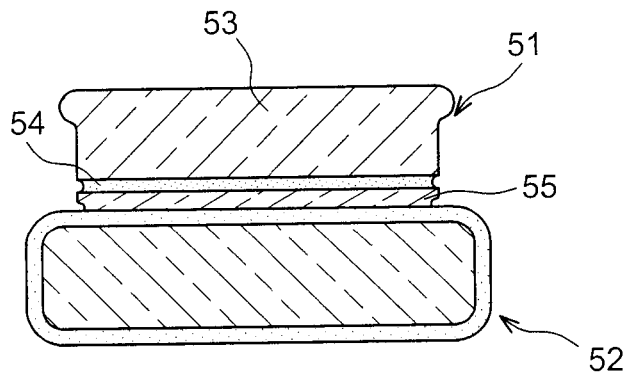
Figure 5C:
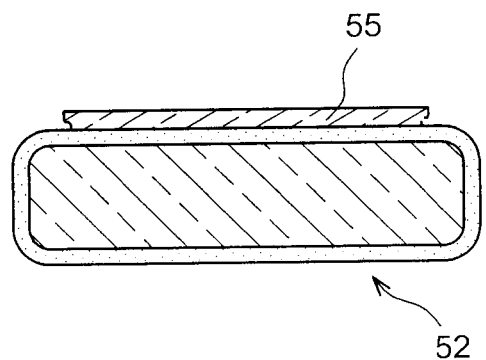

FIGS. 5A to 5C are cross sectional views illustrating a third embodiment of the method of the invention.

FIG. 5A shows the assembly of a first wafer 51 and a second wafer 52 bonded to one another via the contact faces. The wafer 51 comprises a support 53, for example made of silicon, which successively supports a sacrificial layer 54 and a thin layer 55. If the thin layer 55 is made of silicon, the sacrificial layer 54 may be made of porous silicon. The wafer 52 is a silicon wafer 56 covered by a protective layer made of silicon oxide 57. The wafers 51 and 52 have been bonded to one another by a molecular adhesion technique at ambient temperature, wherein the thin layer 55 is brought into contact with the protective layer 57.

FIG. 5B shows the structure obtained after chemical etching designed to form the pedestal. All of the elements forming the wafer 51 have been etched. This figure shows that the pedestal of the first wafer 51 now rests entirely on the contact face of the second wafer 52.

We then carry out the etching of the first wafer by a lift-off technique, by selectively etching the sacrificial layer 54. If the layer 54 is made of porous silicon and the thin layer 55 of silicon, the etching of the sacrificial layer 54 may be obtained by a mixture of water, HF and $H_2O_2$. We obtain the structure shown in FIG. 5C, wherein the thin layer 55 can be made even thinner, for example mechanically.

Figure 6:
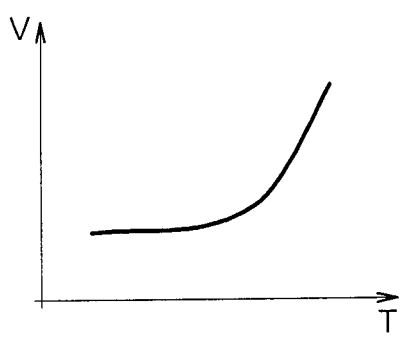
FIG. 6 is a diagram showing the speed of etching of a chemical etching solution according to temperature.

The temperature of the chemical etching solution (for example a TMAH solution at 25%) used to obtain the pedestal may be modified to modify the speed of the etching of the first wafer (for example made of silicon). FIG. 6 shows the rate of the etching speed graph V of the silicon by the TMAH according to the etching temperature T.

Apart from the temperature, the speed of etching of the solution may be modified if the composition of the etching solution changes. Similarly, the various modes for using this etching solution allow the etching speed to be modified (for example recirculating to a greater or lesser extent the solution in an etching bath, the use of megasonics).

The dimension of the silicon to be removed (80 μm in the previous examples) may vary from a few tens of micrometres to a few hundred micrometres. The minimum dimension to be achieved by this removal is advantageously around the dimension of the dimension to be achieved after the rapid etching of one of the wafers aimed at forming the thin part (or thin layer) of this wafer. For example, the dimension to be removed may be 50 μm if the thin layer to be obtained is 20 μm. At minimum, the fine thinning operation is carried out before reaching the pedestal.

In the case of bonding by molecular adhesion, the temperature of the heat treatment used to strengthen the molecular adhesion may be situated in a very wide range, for example greater than 100° C. Various surface cleaning techniques may be used prior to the adhesion: chemical preparation of the surfaces, activation of the surfaces via plasma, UV, ozone, or possibly a combination. The adhesion may also be carried out in a partial vacuum.

The lateral penetration of the etching solution at the bonding interface may be modified by modifying the adhesion energy of the two wafers. Lower energy leads to greater penetration of the etching solution at the bonding interface and thus requires more trimming by chemical etching. The thin layer obtained thus has a smaller diameter. The adhesion energy may thus be used as a means of controlling the width of the trimming.

Furthermore, the nature of the protective layer, an oxide in the previous examples, may be modified and the etching solution may be adapted to carry out the lateral etching.

These etching methods may also be chosen to etch the protective layer and/or to create the pedestal to obtain a specific wafer edge required for the application in question (hollow or protruding).

Figure 7A:
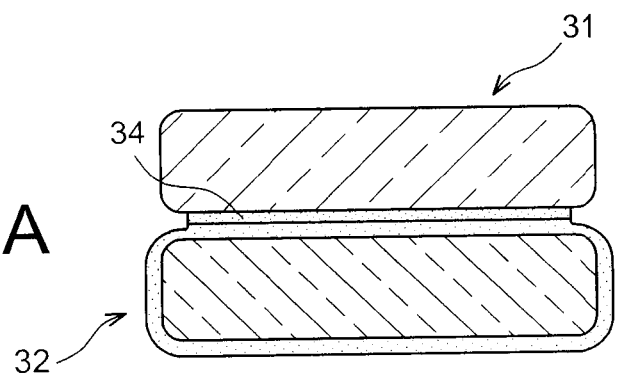
FIGS. 7A to 7C show a fourth embodiment of the method of the invention.
Figure 7B:
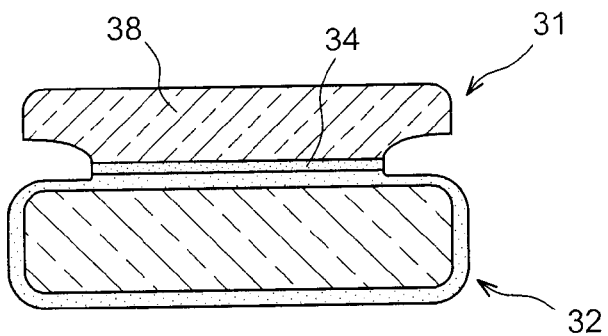
Figure 7C:
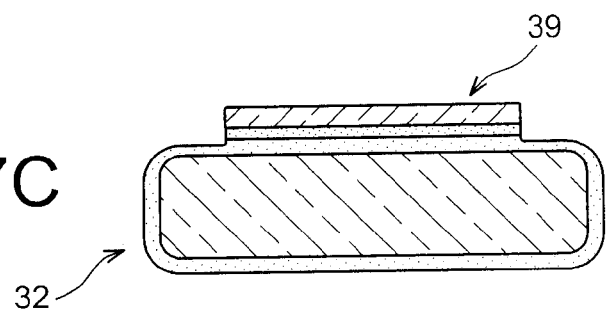

FIGS. 7A to 7C are cross sectional views illustrating a fourth embodiment of the method of the invention. These figures are to be compared with the FIGS. 4B to 4D. In the case of FIG. 7A, the lowering of the bonding energy between the first wafer 31 and the second wafer 32 (for example silicon wafers initially covered with a silicon oxide layer) allows lateral etching of the protective layer (in this example, of the oxide layer) by the first chemical etching that is more important than for the structure of FIG. 4B. The rest of the method is identical to the second embodiment. We can see in FIG. 7B the part 28 of the pedestal obtained after the second chemical etching. We can see in FIG. 7C the thinned part 39 of the first wafer.

Figure 8:
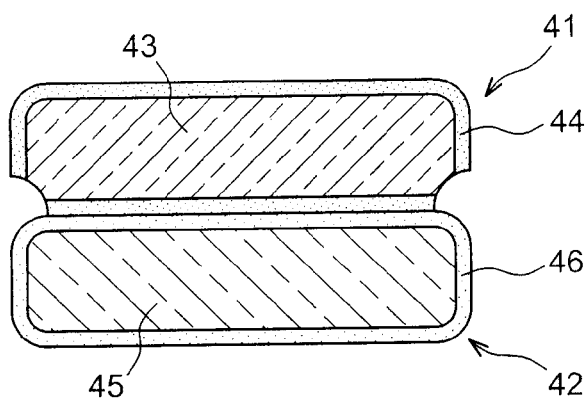
FIG. 8 shows a step of a fifth embodiment of the method of the invention.

A fifth embodiment of the method of the invention consists of only removing the protective layer (the oxide layer) of the first wafer locally, for example next to the bonding interface. This is what is shown in FIG. 8. This figure is a cross sectional view of an assembled structure comprising a first wafer 41 and a second wafer 42 bonded to one another on the contact faces. The wafer 41 is a silicon wafer 43 covered with a layer of oxide 44. The wafer 42 is a silicon wafer 45 covered with a layer of oxide 46.

Figure 9:
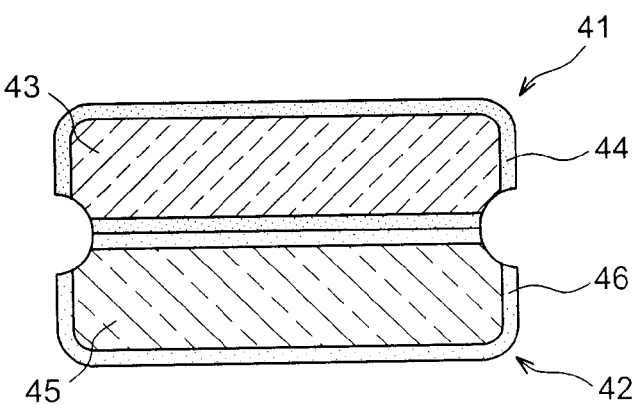
FIG. 9 shows a step of a variant of the fifth embodiment of the method of the invention.

The layer of oxide 44 of the wafer 41 has only been eliminated next to the bonding interface, which has allowed a localised penetration zone to be created for the second chemical etching (chemical etching of the silicon 43). It is also possible to open locally the part of the layer 46 opposite the open zone of the layer 44, which is to say on either side of the bonding interface. This is what is shown in FIG. 9. Lateral soaking in a solution of HF at 10% for a calculated time permits the protective oxide to be removed. The structure obtained is then ready for the etching step that is for example mechanical.

The method of the invention is suited to the creation of stacked structures of the silicon-on insulator type (SOI) with very thin surface film thicknesses (of around one to several micrometres) up to thicknesses of several tens of micrometres, or even several hundreds of micrometres.

The method of the invention can be used for silicon wafers, as well as for other semiconductors (germanium, III-V semiconductors, etc.), for insulating materials (glass, quartz, ceramics, etc.), for piezoelectric materials (lithium niobate, lithium tantalate, etc.).

The invention claimed is:

1. A method for trimming a structure obtained by bonding a first wafer onto a second wafer by contact faces and thinning the first wafer, wherein at least either the first wafer or the second wafer is chamfered and thus exposes an edge of the contact face of the first wafer, wherein the trimming concerns the first wafer, the method comprising:
    a) selecting the second wafer from among the wafers with a resistance to chemical etching planned in b) that is sufficient with respect to the first wafer to allow b) to be carried out;
    b) after bonding the first wafer to the second wafer along the contact face of the first wafer, chemical etching the edge of the first wafer in a vicinity of the contact face of the first wafer to form in the first wafer a pedestal resting entirely on the contact face of the second wafer and supporting the remaining of the first wafer, the chemical etching reducing the surface area of the contact face of the first wafer; and
    c) thinning the first wafer until the pedestal is reached and attacked, to provide a thinned part of the first wafer,
    wherein the selecting a) includes choosing, as the second wafer, a wafer with a layer of at least one material forming a stoppage means of stopping said chemical etching;
    wherein the contact face of the first wafer has a layer that protects against the chemical etching for forming the pedestal, and wherein the protective layer is situated to avoid preventing the pedestal from being formed;
    wherein the protective layer is a layer that initially covers the surface of the first wafer, wherein the method further comprises, prior to the chemical etching to form the pedestal, chemical etching an accessible part of the protective layer; and
    wherein the layer of at least one material forming the means of stopping the chemical etching, on the second wafer, and the protective layer of the first wafer are different in nature, wherein the layer on the second wafer is, in b), etched more slowly than the protective layer of the first wafer.

2. A method for trimming a structure comprising:
    a) bonding a first wafer onto a second wafer by contact faces and by a molecular adhesion technique, wherein bonding energy between the first wafer and the second wafer is taken into account to obtain a reduced surface area of the contact face of the first wafer by a chemical etching;
    b) after bonding the first wafer to the second wafer along the contact face of the first wafer, chemical etching an edge of the first wafer to form in the first wafer an exposed edge of the contact face of the first wafer and a chamfered zone forming a pedestal resting entirely on the contact face of the second wafer and supporting the remaining of the first wafer, the chemical etching reducing the surface area of the contact face of the first wafer; and
    c) thinning the first wafer until the pedestal is reached and attacked, to provide a thinned part of the first wafer.

3. The method of claim 2, wherein the first wafer, or at least its surface, is made of silicon, and the second wafer is chosen from wafers made of quartz, SiC, sapphire, or substituted silicon.

4. The method of claim 2, wherein the thinning of the first wafer is achieved by mechanical and/or chemical etching and/or lift-off and/or dry etching and/or fracture of a buried fragile zone of the first wafer.

5. The method of claim 2, further comprising a polishing after the thinning c).

6. The method of claim 2, wherein the first wafer includes a protective layer against the chemical etching for forming the pedestal, and the method further comprises, prior to the chemical etching for forming the pedestal, chemical etching for eliminating the part of the protective layer located at a level of the pedestal.

7. The method of claim 6, wherein the second wafer also includes a protective layer against the chemical etching for forming the pedestal, the chemical etching to eliminate the protective layer of the first wafer also eliminates the part of the protective layer of the second wafer that is located at the level of the pedestal to create an extension of the pedestal in the second wafer.

8. A method for trimming a structure obtained by bonding a first wafer onto a second wafer by contact faces and thinning the first wafer, wherein at least either the first wafer or the second wafer is chamfered and thus exposes an edge of the contact face of the first wafer, wherein the trimming concerns the first wafer, the method comprising:
    a) selecting the second wafer from among the wafers with a resistance to chemical etching planned in b) that is sufficient with respect to the first wafer to allow b) to be carried out;
    b) after bonding of the first wafer to the second wafer along the contact face of the first wafer, chemical etching the edge of the first wafer in a vicinity of the contact face of the first wafer to form in the first wafer a pedestal resting entirely on the contact face of the second wafer and supporting the remaining of the first wafer, the chemical etching reducing the surface area of the contact face of the first wafer; and
    c) thinning the first wafer until the pedestal is reached and attacked, to provide a thinned part of the first wafer,
    wherein the first wafer is bonded onto the second wafer by a molecular adhesion technique; and
    wherein bonding energy between the first wafer and the second wafer is taken into account to obtain the reduced surface area of the contact face of the first wafer by the chemical etching.

* * * * *